(12) United States Patent
Diep (10) Patent No.: US 7,378,293 B2
(45) Date of Patent: May 27, 2008

(54) MEMS FABRICATION METHOD

(75) Inventor: Buu Quoc Diep, Murphy, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/386,410

(22) Filed: Mar. 22, 2006

(65) Prior Publication Data

US 2007/0224718 A1    Sep. 27, 2007

(51) Int. Cl.
   *H01L 21/00*    (2006.01)
(52) U.S. Cl. .................. 438/48; 438/106; 438/108; 438/114; 438/463; 257/E31.001; 257/E27.001
(58) Field of Classification Search ............ 438/48
   See application file for complete search history.

(56) References Cited

U.S. PATENT DOCUMENTS

| | | | |
|---|---|---|---|
| 4,850,780 A * | 7/1989 | Safabakhsh et al. ..... | 414/416.1 |
| 5,524,765 A * | 6/1996 | Gutentag ..................... | 206/713 |
| 5,953,590 A * | 9/1999 | Piper et al. ................. | 438/113 |
| 7,135,385 B1 * | 11/2006 | Patwardhan et al. ........ | 438/464 |
| 7,169,685 B2 * | 1/2007 | Connell et al. ............. | 438/460 |
| 2002/0178567 A1 * | 12/2002 | Farnworth et al. ......... | 29/426.5 |
| 2004/0129451 A1 * | 7/2004 | Wachtler .................... | 174/260 |
| 2005/0059188 A1 * | 3/2005 | Bolken et al. ............. | 438/106 |
| 2005/0093170 A1 * | 5/2005 | Kalidas et al. ............. | 257/778 |
| 2005/0202651 A1 * | 9/2005 | Akram ....................... | 438/463 |
| 2006/0286707 A1 * | 12/2006 | Hooper et al. ............... | 438/52 |
| 2007/0035807 A1 * | 2/2007 | DiCarlo et al. ............. | 359/291 |

* cited by examiner

*Primary Examiner*—Michael Lebentritt
*Assistant Examiner*—Abdulfattah Mustapha
(74) *Attorney, Agent, or Firm*—W. James Brady, III; Frederick J. Telecky, Jr.

(57) ABSTRACT

A method for singulating a substrate such as a semiconductor wafer populated with a plurality of MEMS devices. A preferred embodiment of the present invention comprises mounting a glass cover onto the wafer, then orienting the wafer and removably mounting it on an adhesive tape. A partial cut or series of partial cuts is then made through the cover to facilitate the later removal of selected cover portions using an automated process. The dice are then separated using a series of full cuts made perpendicular and parallel to the partial cuts and the selected cover portions removed from each die. The separated dice are then packaged for use or for further fabrication.

24 Claims, 7 Drawing Sheets

MEMS FABRICATION METHOD

TECHNICAL FIELD

The present invention relates generally to the fabrication of semiconductor devices, and more particularly to a method for singulating devices that have been formed on a substrate such as a semiconductor wafer without the necessity of repeatedly mounting and demounting the wafer or of using an impact breaking tool to separate the die from each other.

BACKGROUNDS

A MEMS (micro electromechanical system) device is used, for example, in the manufacture of display devices that are controlled by digital information. There are currently in development, and also in use, a number of alternatives to the standard CRT (cathode ray tube) display that has for years been a common manner of displaying visual images and text in such applications as televisions and computer monitors. These new types of displays vary somewhat with respect to each other, but are often superior to CRT displays in that they are more compact, or produce a superior visual image, or both. Digital Light Processing®, or DLP®, commercially available from Texas Instruments of Dallas, Tex., is one such alternative. DLP® is used, for example, to produce the visual displays in high-definition television (HDTV) applications.

Figure 1:
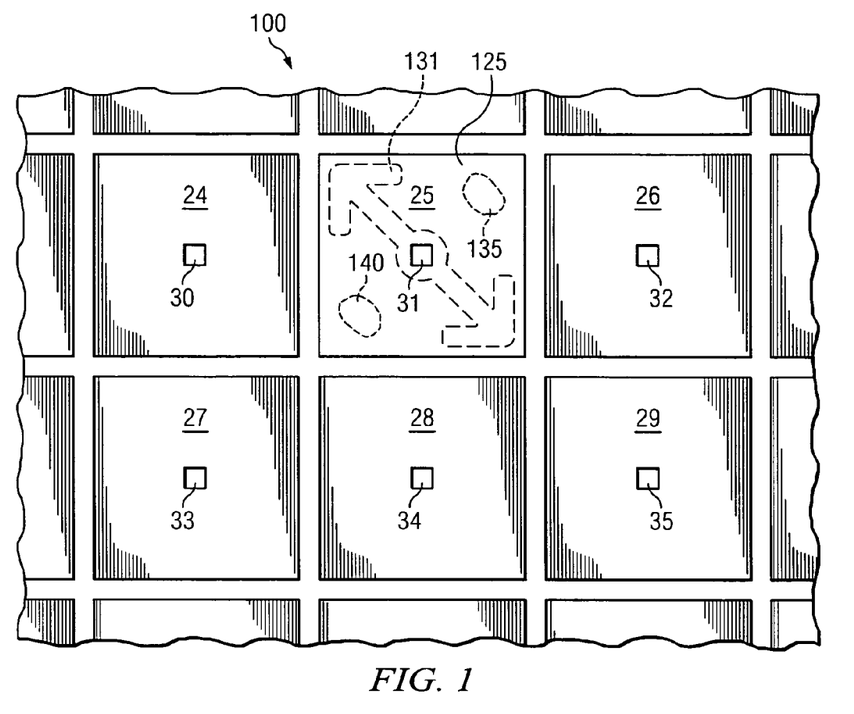
FIG. 1 is an aerial view of a portion of an exemplary DMD.

Naturally, these different types of displays differ primarily with respect to the method by which the image is produced. In a DLP® system, a MEMS device called a DMD (digital micro-mirror device) typically performs a key part of this function. The DMD modulates, that is, alters the characteristics of, light received from a light source by selectively reflecting portions of the received light beam to create an image. FIG. 1 is a partial aerial (plan) view of a DMD 100, exemplary of one that may be used in a DLP® system. The portion of DMD 100 illustrated in FIG. 1 shows micro-mirrors 24 through 29 (partially-shown mirrors are not numbered). Mounting vias 30 through 35 are formed to mount the micro-mirrors 24 through 29, respectively. Note that in this illustration it is assumed that the micro-mirrors are substantially the same and mounted in the same way, so only one of them will be discussed in detail.

Micro-mirror 25 for example, is a very small mirror having a reflecting surface 125. It is mounted by via 31 onto a hinge 131 that allows micro-mirror 25 to tilt in two or more directions. The direction at which each individual micro-mirror is tilted at any given moment determines the direction in which light striking the mirror surface 125 will be reflected. The direction of mirror tilt is controlled by small electrical voltages alternately applied to posts 135 and 140, which either attract or repel a nearby portion of the micro-mirror 25, causing it to retain or to change its orientation. A memory cell (not shown) located underneath micro-mirror 25 allows the controlled-voltage operation, and the memory cell is in turn driven by a controller located elsewhere (and also not shown in FIG. 1). Note that although only six micro-mirrors are fully shown in FIG. 1, the typical DMD device contains thousands—often on the order of one million of such devices fabricated onto a square or rectangular-shaped die (see FIG. 3) that itself typically measures only between one and two centimeters on a side.

Figure 2:
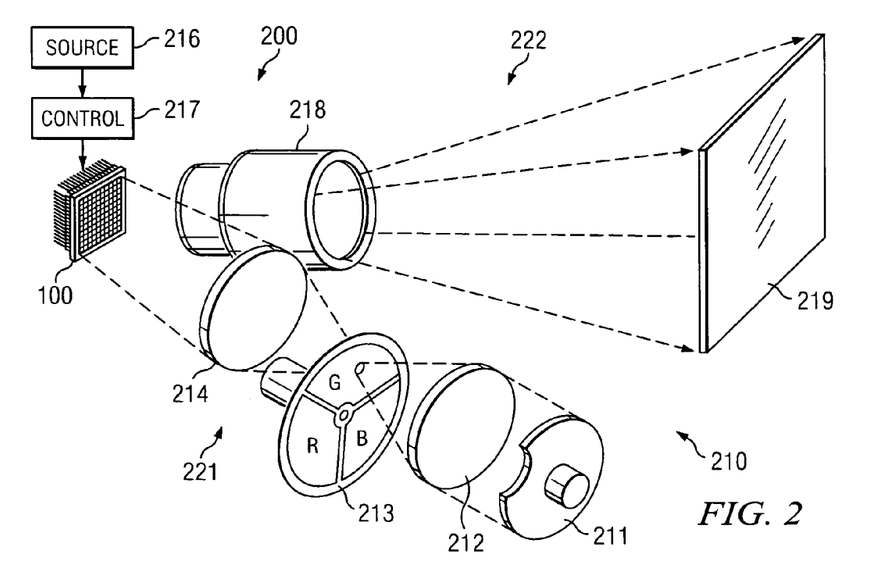
FIG. 2 is simplified block diagram illustrating selected components of an exemplary projection display system that may be assembled using the DMD of FIG. 1.

The cumulative effect of reflecting light off of these selectively controlled micro-mirrors is to create an image. This image, naturally quite small, is then passed through a projection lens to convert it to an appropriate size for viewing. FIG. 2 is simplified block diagram illustrating an exemplary optical display system 200 that may be assembled using DMD 100 of FIG. 1. Light from a light source 211, which may be an arc lamp or an LED, is collimated and directed along a first portion 221 of the optical path 210. A color wheel 213 is used to produce selectively-colored light for producing colored images. The condenser lenses 212 and 214 shape the beam of light as it propagates along the first portion 221 of optical path 210. The selectively-colored light eventually falls on the DMD 100, where it is transformed into a visual image. The visual image created by DMD 100 is directed to a second portion 222 of the optical path 210, which includes a display screen 219, which may, for example, be an HDTV screen, presents the visual image display intended to be seen by the viewer. The projection lens 218 enlarges the image created by DMD 100 so it will fit the display screen 219.

Figure 3:
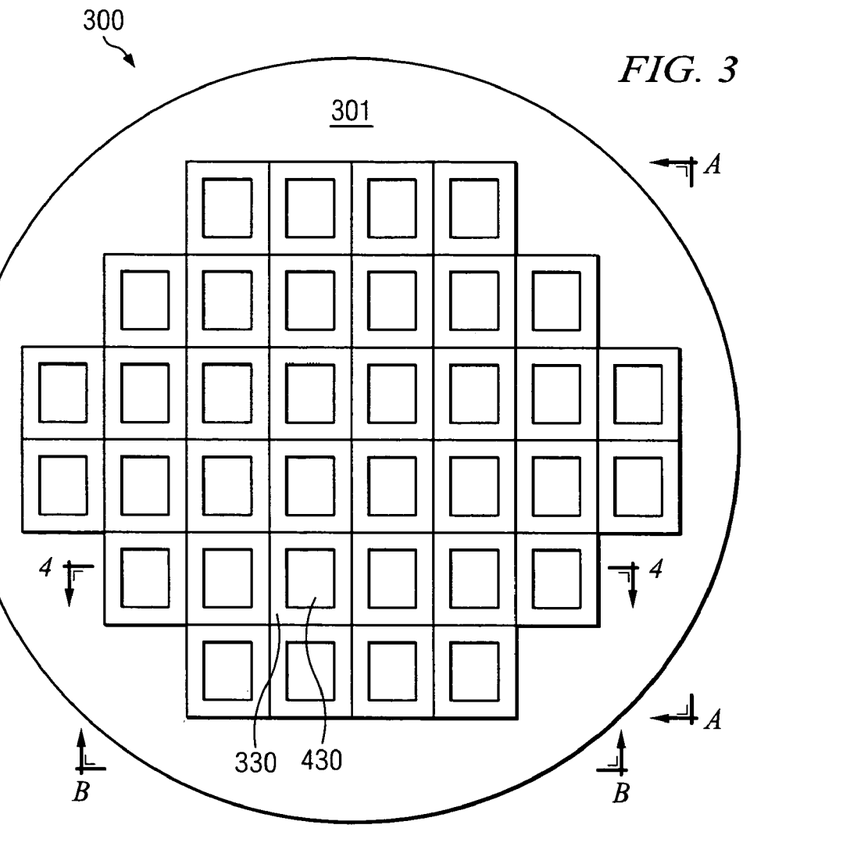
FIG. 3 is an aerial view of a semiconductor wafer populated with a plurality of MEMS devices.

In order to manufacture DMD 100 and similar MEMS devices, a modified form of the standard semiconductor fabrication process may be used. FIG. 3 is an aerial view of a semiconductor wafer 300 used in such a process. This wafer is typically a very thin slice from an ingot of silicon or some other suitable material. The surface 301 of semiconductor wafer 300 is then populated, through a number of fabrication process steps, with many electrical, and the case of a MEMS device, electromechanical components. These components are formed by a series of steps that use such methods as ion implantation, the deposition of layers of new materials, and patterned etching of the various created surfaces. Many of these processes are automated or semi-automated for both efficiency and precision.

The tiny components formed on the semiconductor wafer, such as micro-mirrors, memory cells, and transistors, combine to form a chip, which is an independently functioning device for use in applications such as DLP®. Because these chips are so small, a large number of them may be formed on a single wafer such as wafer 300. In FIG. 3, wafer 300 is shown to be populated with thirty-six chips, although in practice there tends to be a greater number of them. Each chip is situated on a portion of wafer 300 that is sometimes called a die. When all or most of the fabrication steps have been completed, the dice are separated in a process known as singulation. Each of the separated devices, or at least those that have passed inspection, may then be used in an application such as the projection display system 200 of FIG. 2.

Needless to say, singulation is an important part of the fabrication process. The dice must be separated from each other in such a manner so as not to damage chip components. Singulation is frequently performed in a multi-step sawing and breaking process (described in greater detail below) that is designed to ensure device integrity to the greatest extent possible.

MEMS device chips such as those used for DMDs pose a somewhat unique challenge in the singulation portion of the fabrication process. When they are used for optical applications such as projection display system, for example, one surface of the chip must be able to receive and to reflect light for the chip to perform its function. Because the reflecting surface is actually made up of thousands of tiny micro-mirrors that are continually being reoriented, the reflecting surface is provided with physical protection in the form of a cover made of a glass or some similar material. The glass cover typically includes a cover wafer, that is, a relatively flat plate that is separated slightly from the chip reflecting surface in order to allow the micro-mirrors to operate. This separation is often achieved using an interposer layer (or wafer). The interposer layer typically forms a grid so that the reflecting surface for each chip is left exposed and the light path to it is unobstructed. Along with the wafer itself, the cover wafer and the adjacent members of the interposer grid form a sealed recess above the reflecting surface.

Figure 4:
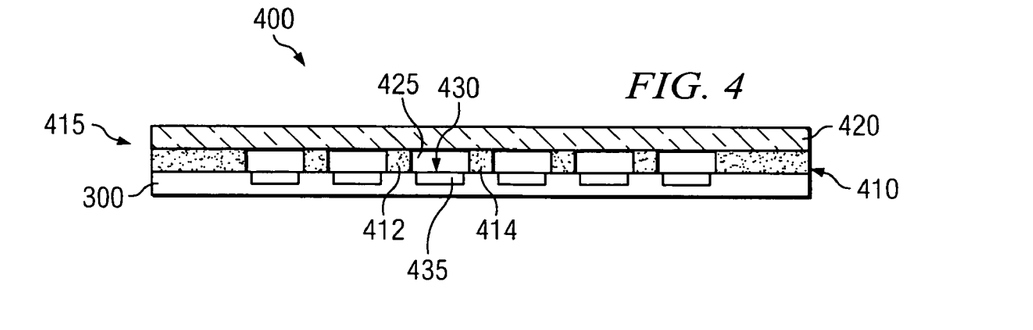
FIG. 4 is a cross-sectional elevation view of an exemplary MEMS wafer assembly.

This wafer assembly configuration is illustrated in FIG. 4. FIG. 4 is an elevation (side) cross-sectional view of an exemplary MEMS wafer assembly 400. The view is taken from the perspective of section line 4-4 shown in FIG. 3 (note that FIG. 3 itself shows only the wafer 300). In the view of FIG. 4, six substantially identical active areas are visible, and exemplary one of which is numbered 435. Each active area includes the many micro-mirrors such as those illustrated in FIG. 1. At the top of exemplary active area 435 is formed a reflecting surface 430 (also enumerated in FIG. 3). As can be seen in FIG. 4, wafer 300 is overlaid with an interposer grid layer 410, which is secured in place using an adhesive material (not shown). Note that only the latitudinal grid members, for example members 412 and 414, are shown in FIG. 4; the longitudinal grid members are for clarity omitted. Note also that the terms 'latitudinal' and 'longitudinal' (and correspondingly the 'rows' and 'columns' of dice shown in FIG. 3) are used herein for convenience but are arbitrarily chosen and distinguishable only relative to one another unless otherwise noted or apparent from the context.

A glass cover wafer 420 is mounted to interposer layer 410, typically likewise using an adhesive (not shown). Together glass cover wafer 420 and interposer layer 410 may be said to form a cover or cover assembly 415. The cover assembly may be formed of two or more components, as shown in FIG. 4, or may be formed as a unit. In any case, care must be taken when singulation is performed so as not to damage the cover assembly 415 so that the recess 425, the space created above active area 435 (as well as the other, similar recesses), remains sealed against intrusion by water vapor or other deleterious materials. Of course, undue damage to the wafer 300 must be avoided as well.

Current wafer singulation methods approach this challenge by using a partial-saw and break method. A saw cut creates a fault-line so that the dice may be separated using an impact tool. For MEMS dice this can be a somewhat complicated and cumbersome procedure. If a method could be devised to singulate MEMS dice using a relatively-simple procedure that nevertheless achieves a higher product yield and reliability, production costs could be reduced. The method of the present invention provides just such a solution.

SUMMARY OF THE INVENTION

These and other problems are generally solved or circumvented, and technical advantages are generally achieved, by preferred embodiments of the present invention in which devices are formed together on a substrate such as a semiconductor and then advantageously separated for use.

In accordance with a preferred embodiment of the present invention, a method for fabricating a MEMS (micro-electromechanical system) device comprises forming a plurality of dice on a substrate, each die having an active area, and then mounting a cover on the wafer, the cover comprising a grid for supporting a cover wafer in a spaced-apart relationship above the active areas. Once the cover has been mounted, the method continues with cutting part-way through the cover to create at least one linear partial cut that is not above an active area. Full cuts are then made through both the cover and the wafer so as to separate each die of the plurality of dice from the other dice. A portion of the cover disposed between a partial cut and an edge created by a full cut is then removed, preferably using an automated process, and in this embodiment before each individual die removed from the adhesive tape and packaged.

In accordance with another preferred embodiment of the present invention, a method for singulating a semiconductor wafer assembly having a wafer populated with a plurality of dice and a cover mounted on the wafer above the plurality of dice comprises forming a linear partial cut into but not through the cover, cutting through the cover and the wafer along at least one line substantially perpendicular to the linear partial cut, and cutting through the cover and the wafer along at least one line substantially parallel to the linear partial cut. In a preferred embodiment, cutting through the cover and the wafer is performed by making a first cut partially through the cover, and then proceeding to cut along the same line using a thinner cutting tool to cut through the remainder of the cover and through the wafer.

A more complete appreciation of the present invention and the scope thereof can be obtained from the accompanying drawings that are briefly summarized below, the following detailed description of the presently-preferred embodiments of the present invention, and the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

Presently preferred embodiments of the present invention and their implementation are discussed in detail below. It should be appreciated, however, that the present invention provides many applicable inventive concepts that can be embodied in a wide variety of specific contexts. The specific embodiments discussed are merely illustrative of specific ways to make use of the invention, and do not limit the scope of the invention.

The present invention will be described with respect to preferred embodiments in a specific context, namely the fabrication of a particular MEMS (micro-electromechanical system) device known as a DMD (digital micro-mirror device) that is formed on a silicon wafer and has a glass cover or cover assembly that includes a glass cover wafer and an interposer grid. The invention may also be applied, however, to other similar semiconductor structures and make use of other materials as well.

Figure 5:
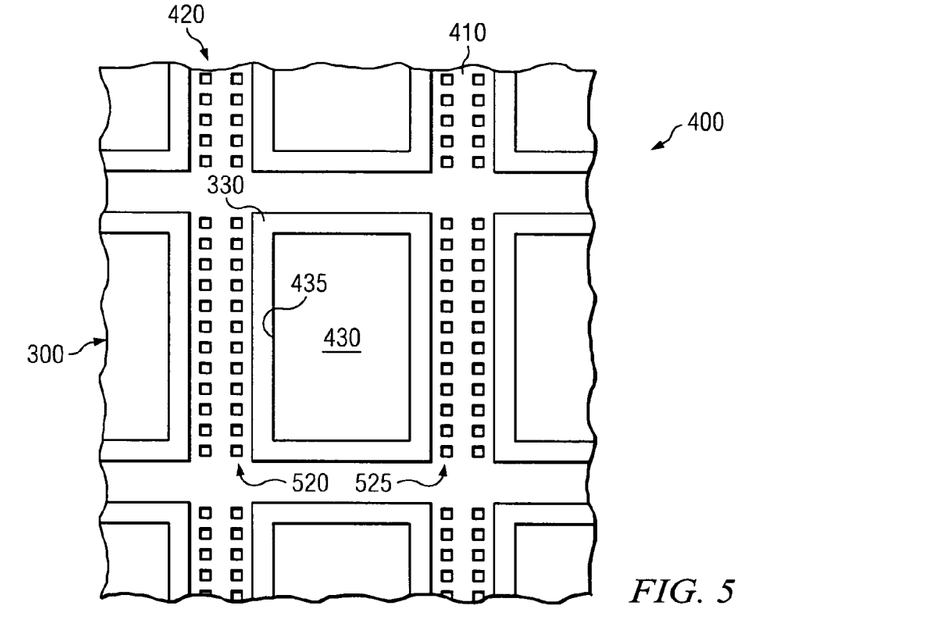
FIG. 5 is an aerial view of a portion of a wafer assembly, used to illustrate an embodiment of the method of the present invention.

FIG. 5 is an aerial view of a portion of MEMs wafer assembly 400, which will be used to illustrate an embodiment of the method of the present invention. Glass cover wafer 420 is generally referred to in FIG. 5. While it extends over the entire portion of wafer assembly 400 that is shown in FIG. 5, in this embodiment the glass cover wafer 420 is transparent and so certain of the other components are visible through it. These components include wafer 300, having formed upon it a die 330 with a reflecting surface 430. As mentioned above, in a MEMS device such as a DMD, the device's active array includes a reflecting surface of micro-mirrors. This area is left exposed for the proper transmission of light propagating, for example, along the optical path of a projection display system. The reflecting surface is also disposed within a small recess that permits operation of the micro-mirrors. The interposer grid layer 410 (in this embodiment transparent) is therefore formed to overlay the wafer 300 around the periphery of each of these active arrays. (The amount of the periphery covered by the interposer grid layer 410 may vary from one embodiment to the next. See for example FIGS. 7b and 7d.) The members of the interposer grid layer 410 also form the sides of the recesses that are created to protect the reflecting surfaces, as well as the other components of the active arrays.

Each die such as die 330 also, in this typical configuration, includes a first bond pad site 520 and a second bond pad site 525. The bond pad sites are each populated with a number of bond pads, each bond pad being connected with one or more components (not shown) in the active array and used as necessary to make external connections to these components. At the stage of fabrication illustrated in FIG. 5, however, they have been partially or completely covered by the interposer grid layer 410 and will be exposed later in the process, preferably after the wafer 300 has been cut into separate dice. In conventional singulation, this uncovering of the bond pad site is typically done manually using a razor blade or other sharp cutting tool. This may create safety concerns. In accordance with the present invention, the process may be automated, as will be described below.

First, however, the conventional process will be reviewed in more detail for comparison. In the conventional process of singulation by breaking a wafer assembly into individual devices, the wafer is first mounted on a flexible adhesive tape. Orientation flats are then created to orient the wafer during the fabrication process. For example, flat sides to the wafer 300 may be created along either of the lines labeled A-A or B-B (or both) shown in FIG. 3. This is often done by partially sawing through the wafer along these lines, then impacting the partially sawed region with an impact tool such that a relatively clean break is achieved. Either before or after partially sawing the flats, a partial cut is also made between each of the die through the class cover and partially through the interposer. (Two partial cuts may be made in the vicinity of the bond pad sites, which are usually located adjacent each other proximate to two adjacent dice. This facilitates the later removal of the 'swizzle sticks', or the portion of the interposer grid that is covering the bond pads.) The partially-sawed wafer is then removed from the tape and reversed.

Removal of the wafer from the tape involves exposing the assembly to UV light to weaken the adhesive, then demounting the wafer. The wafer is then turned over and mounted to a second tape. Using the flats for orientation, the now exposed silicon wafer is partially sawed at break locations, which of course should coincide with approximately the center of the interposer grid members positioned between each die. When this partial sawing operation is complete, The wafer is again exposed to UV light and demounted. At this point in the conventional process, an impact tool is used to break the wafer into strips, and then again to break each of the strips into individual dice. Manual swizzle stick removal is often done at this point. These separated dice may be remounted and rinsed with DI water before being demounted for inspection and packaging.

Figure 6:
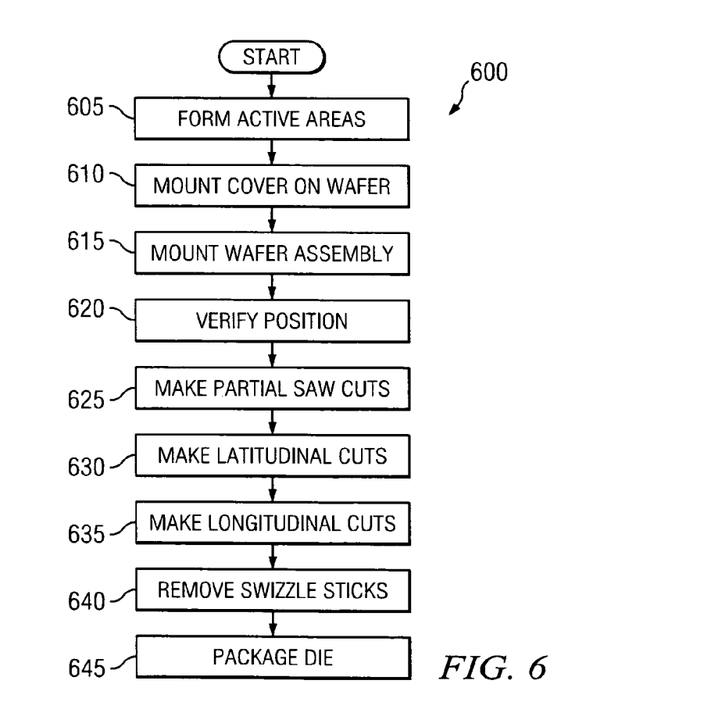
FIG. 6 is a flow diagram illustrating a method of fabricating a plurality of MEMS devices according to an embodiment of the present invention.

The present invention is directed to a comparatively more efficient process for singulation of the dice on a wafer, such as those used for DMDs or for other, similar types of MEMS devices having a wafer assembly identical or similar to that illustrated in FIG. 4. Exemplary methods will now be described. FIG. 6 is a flow diagram illustrating a method 600 according to an embodiment of the present invention. At START it is assumed that the tools and materials necessary to implement a preferred embodiment of the present invention are available and operational. It is further assumed that a silicon wafer or similar substrate has been prepared. The process begins with forming a plurality of active areas on the surface of the wafer (step 605). In practice, this will of course take a number of process steps, which are not individually shown in FIG. 6. The wafer also undergoes one or more inspections and any dice to be rejected are identified, although this step is not a requirement of the present invention unless explicitly recited.

The method 600 continues with the placing of a glass cover on the wafer (step 610). The glass cover normally includes a cover wafer mounted in a spaced-apart relationship to the active area on the wafer by an interposer grid that is mounted between the silicon wafer and the cover wafer. In one embodiment, the interposer may be mounted first to the silicon wafer, in another the interposer is first mounted to the cover wafer and then the cover assembly is mounted as a unit onto the silicon wafer. An appropriate adhesive curing time is then allowed to elapse (not shown), if necessary, before the process continues. In another embodiment, the entire wafer assembly is simply provided before beginning the method of the present invention.

In the embodiment of FIG. 6, the method continues with removeably mounting the wafer assembly on a tape (step 615). Other methods of mounting may be used as well, but are not separately shown in FIG. 6. Once mounted, the position and orientation of the wafer assembly is verified (step 620), to the extent necessary. This may be done manually or automatically using a reference notch or other fiducial. Note, however, that in accordance with this embodiment of the present invention, wafer flats need not be created for orientation purposes. A partial saw cut is then made, preferably just to the interior of the bond pad site adjacent each wafer (step 625). A single linear cut with respect to each bond pad region is preferably made for this purpose. The approximate location and length of these partial cuts according to this embodiment may be seen in FIGS. 7a and 7b.

Figure 7A:
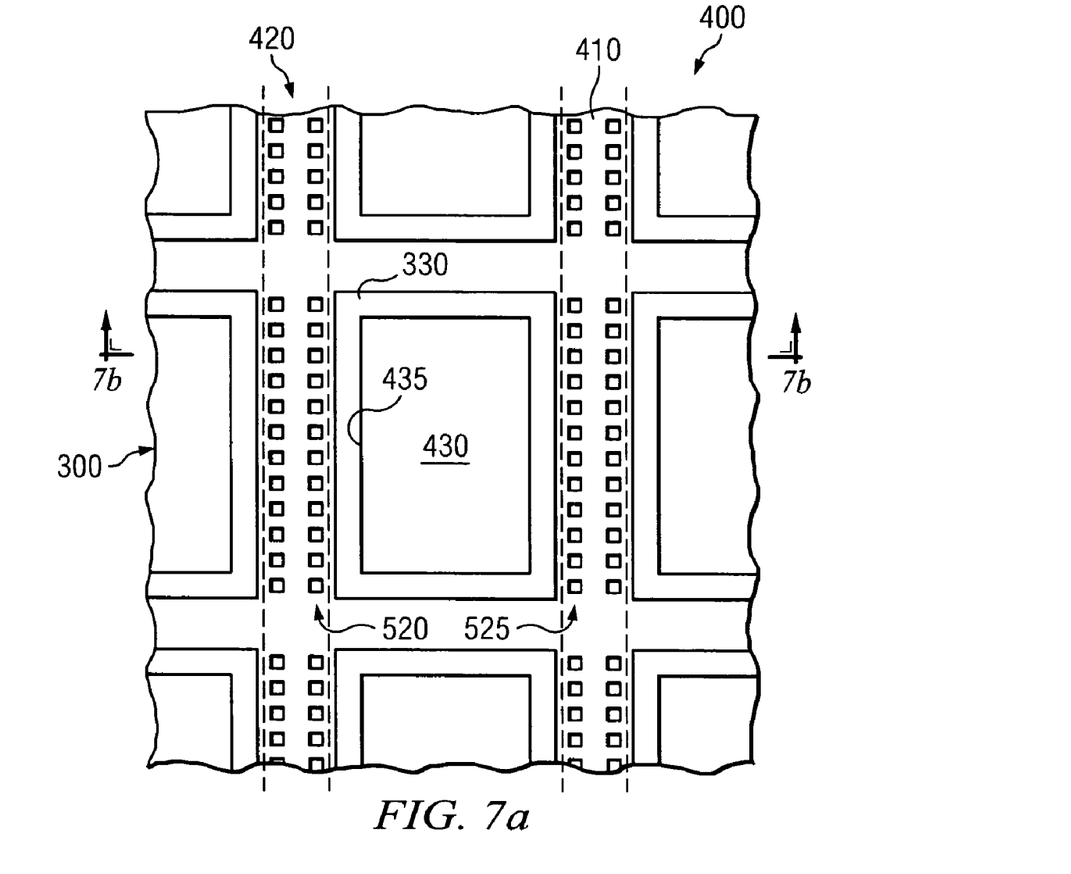
FIG. 7a is an aerial view of a portion of a wafer assembly illustrating the approximate location of partial cuts according to an embodiment of the present invention.
Figure 7B:
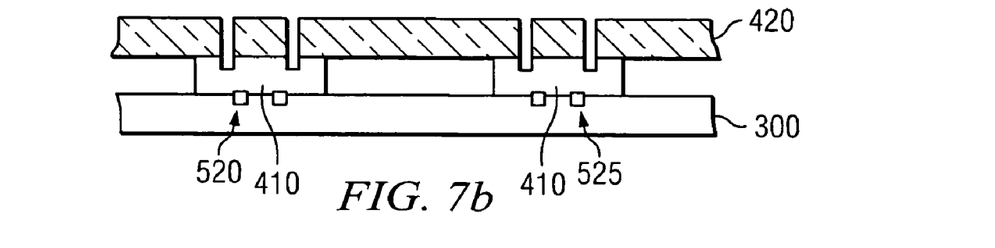
FIG. 7b is a cross-sectional elevation view of the wafer portion of FIG. 7a that is taken along section line b-b after the partial cuts indicated by the broken lines in FIG. 7a have been made.

FIG. 7a is an aerial view of a portion of wafer assembly 400 illustrating with broken lines the location of each of these partial cuts according to this embodiment of the present invention. FIG. 7b is a cross-sectional elevation view of the wafer portion of FIG. 7a illustrating the depth and location of the partial cuts made in step 625 according to this embodiment of the present invention. Visible in FIG. 7b are the semiconductor wafer including bond pad sites 520 and 525 (but for simplicity the active areas are not shown), interposer grid layer 410, and glass cover wafer 420. Thin layers of adhesive (now shown), in this embodiment, bind the wafer, interposer, and cover wafer together. These partial cuts are, in a presently preferred embodiment, made using a saw blade having a width of 10 mils (254 microns) and produce a cut approximately one-half way through the thickness of each grid member of interposer 410. The size of the cutting tool, however, and the relative location and length of these partial cuts may vary in other embodiments (not shown).

Figure 7C:
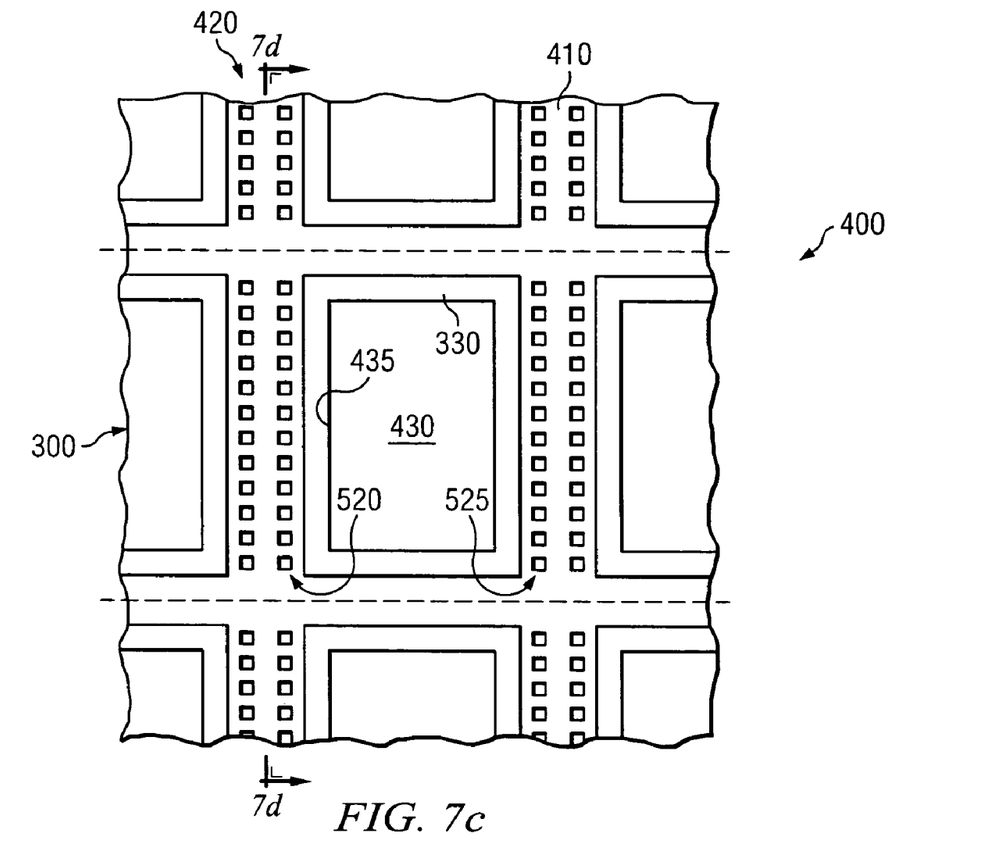
FIG. 7c is an aerial view of the wafer portion of FIG. 7a showing a preferred location of latitudinal full cuts according to an embodiment of the present invention.
Figure 7D:
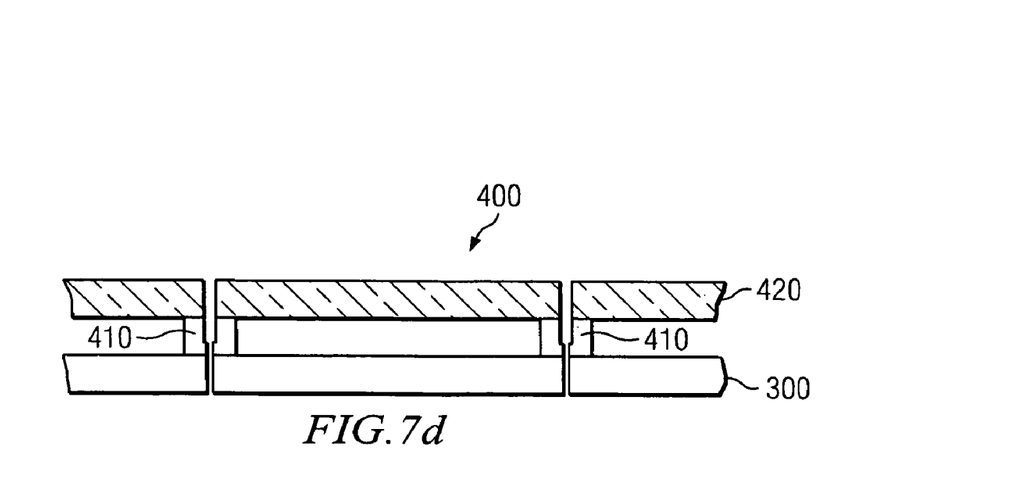
FIG. 7d is a cross-sectional elevation view taken along section line f-f in FIG. 7c after the latitudinal full cuts indicated by the broken lines have been made.
Figure 7E:
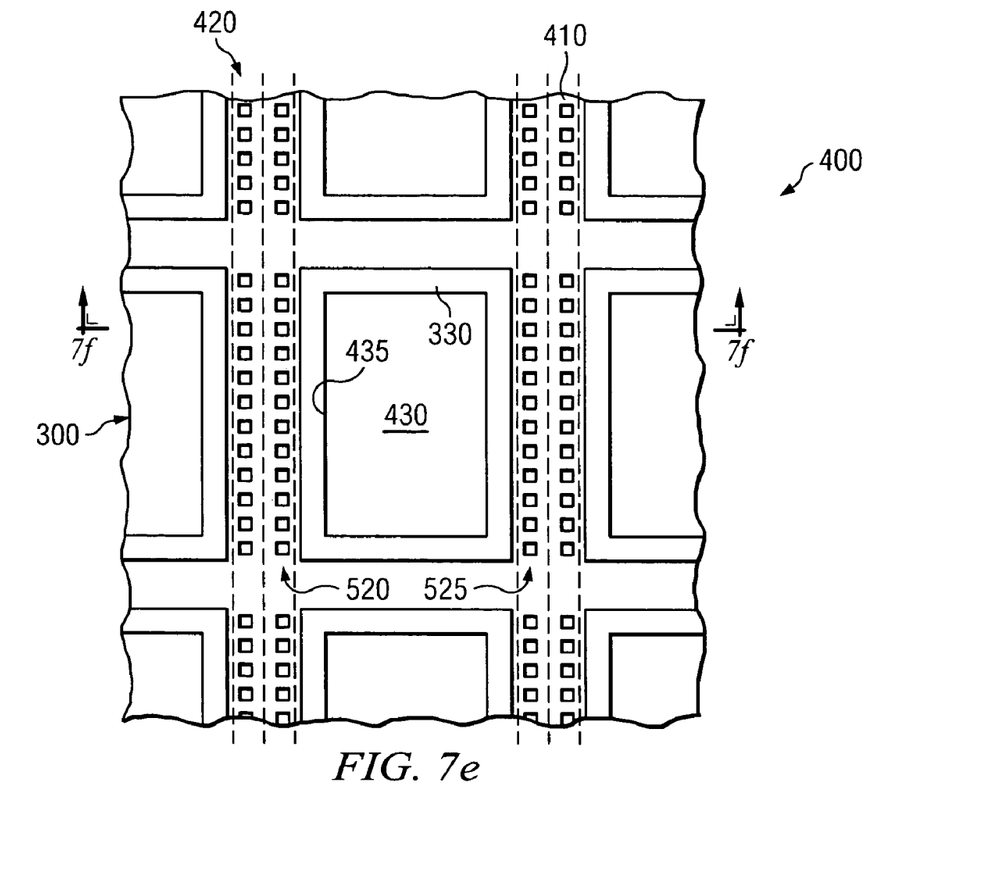
FIG. 7e is an aerial view of the wafer portion of FIG. 7a showing a preferred location of longitudinal full cuts according to an embodiment of the present invention.

Once the partial cuts are made in step 625 a full cut (or series of full cuts, as necessary) is made, that is, a cut completely through the glass cover and the silicon wafer. In this embodiment of the present invention, at least one full cut is first made latitudinally (step 630), that is, substantially perpendicular to the partial cuts, so as to cut the dice into strips. The latitudinal cuts are made approximately one-half way between each adjacent row of dice active areas. A second series of full cuts is then made (step 635) in the longitudinal direction to separate the individual dice from each other. FIGS. 7c and 7e are aerial views of a portion of wafer assembly 400 showing by broken line the preferred locations of the latitudinal and longitudinal full cuts, respectively.

Figure 7F:
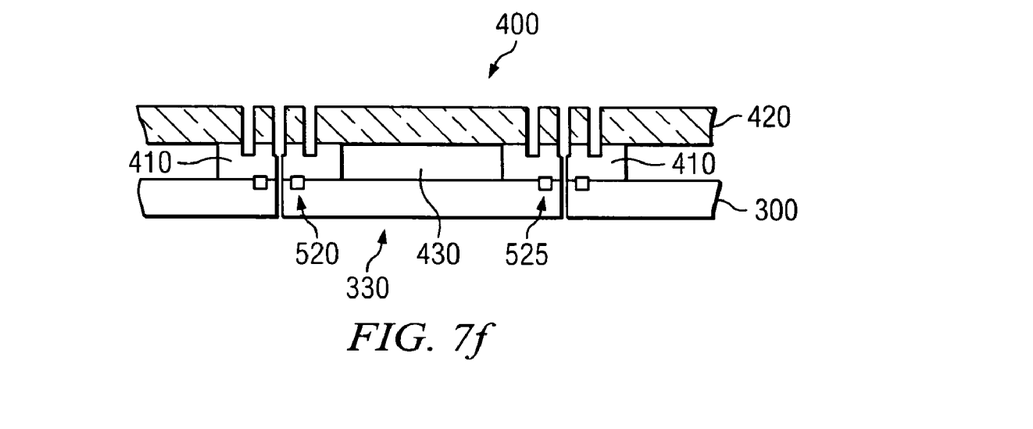
FIG. 7f is a cross-sectional elevation view taken along section line f-f in FIG. 7e after the longitudinal full cuts indicated by the broken lines have been made.

The full cuts, or a select number of them, may be made using, for example, a 10 mil saw blade. In a preferred embodiment, however, the full cuts are each made in a two step cutting process, as illustrated by FIGS. 7d and 7f. FIG. 7d is a cross-sectional elevation view of a portion of wafer assembly 400, taken from the perspective of section line d-d shown in FIG. 7c. As should be apparent, a partial saw cut is first made using a first cutting tool, for example a 10 mil saw blade, through cover wafer 420 and partially through each of the grid members of interposer 410. The first cutting tool is then removed and a second cutting tool, for example a 4 mil saw blade, is inserted into each of the cuts already made and used to complete the full cut by cutting through the remainder of the interposer grid members and then all of the way through the wafer 300. In this embodiment, the second cutting tool is preferably thinner than the first cutting tool, as described above. Additional cutting tools may be employed in making the full cuts, for example, by withdrawing the second cutting tool and replacing it with a third, although using more than two cutting tools is not presently preferred.

The longitudinal full cuts are executed in a similar fashion. FIG. 7f is a cross-sectional elevation view of a portion of wafer assembly 400, taken from the perspective of section line f-f shown in FIG. 7e. In this embodiment, the full cut has been made using two cutting tools with the second being thinner than the first, to create full cuts (two are visible in this view). Each of these cuts is formed between the partial cuts made in step 625 (shown in FIG. 6), and between the bond pad sites associated with adjacent dice. In one embodiment, this first cut is made with the first cutting tool approximately one-half way through the thickness of interposer grid member 410. In the embodiment of FIGS. 7d and 7f, it is made to a depth just greater than that of the partial cuts (shown in FIG. 7f). Of course, the first longitudinal and latitudinal cuts may be made to different depths if desired. Again, it is preferred though not required that the longitudinal full cuts and the latitudinal full cuts be made in this fashion.

Note, however, that the cuts described above may be made in any logically-permissible order. In one alternate embodiment (not shown), the full cuts are made and the dice separated prior to making the partial cuts, although this sequence is not preferred. In another embodiment, again not preferred, longitudinal and latitudinal full cuts are made alternately until a certain number or all of the dice have been separated. In any case, however, once the separated dice have been prepared, the swizzle sticks are removed (step 640). The die are then packaged (step 645) for use or for further fabrication, as appropriate.

As alluded to above, the swizzle stick removal of step is preferably though not necessarily done by automatic operation. Singulating the dice on the wafer does not preclude the use of conventional processes for shaving portions of the cover from the separated die. An advantage of embodiments of the present invention, however is that they facilitate automated swizzle stick removal. In such an embodiment, the swizzle sticks are removed while the dice are still mounted in position on the tape. Because the full cuts separating the dice are preferably made from the front of the wafer assembly (that is, through the cover first, and then the wafer), the assembly need not be demounted. Once orientation and location are accomplished to the extent necessary to make the cuts, the position of each element of the wafer assembly should be determinable to the extent required for automated swizzle stick removal.

Figure 8A:
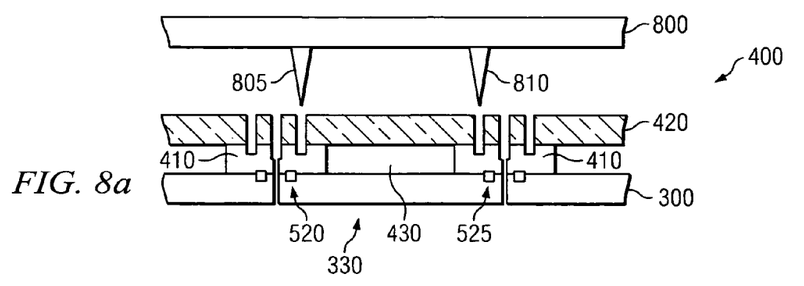
FIGS. 8a, 8b, and 8c are the cross-sectional elevation views of the wafer portion of FIG. 7f, respectively illustrating alternate embodiments of the present invention.
Figure 8B:
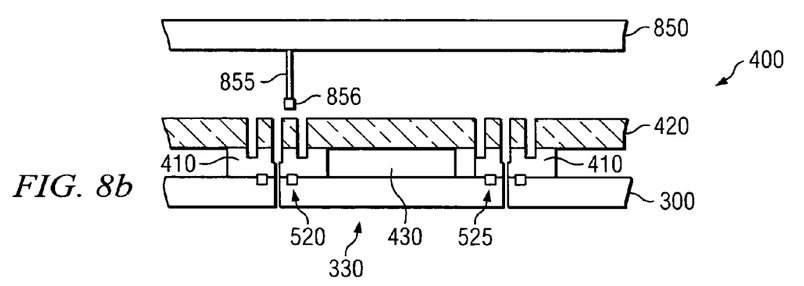

A number of methods may be used for this process, as illustrated in FIGS. 8a and 8b. FIG. 8a is the cross-sectional elevation view of FIG. 7f illustrating a method of swizzle stick removal according to one embodiment of the present invention. In this embodiment, a removal tool 800 having a first wedge member 805 and a second wedge member 810 is positioned over the MEMs wafer assembly 400, and in particular above die 330, so that the wedge members substantially align with the partial cuts made adjacent to first bond pad site 520 and second bond pad site 525. When positioned, the wedges are forced downward into the partial cuts to a predetermined depth, or until failure of the material holding the swizzle sticks in place has been detected. This procedure may then be repeated for the remaining dice. Once removed, the swizzle stick material may be removed, for example, by vacuuming or by inverting the mounted wafer assembly. Note that the removal tool may, instead of the configuration of FIG. 8a, include either one, or more than two wedge members, with the number of removal steps varying accordingly. Note also that the shape and relative size of the wedge members are exemplary rather than limiting, and in some embodiments (not shown) a single removal tool may include wedge members of varying size and shape.

Figure 8C:
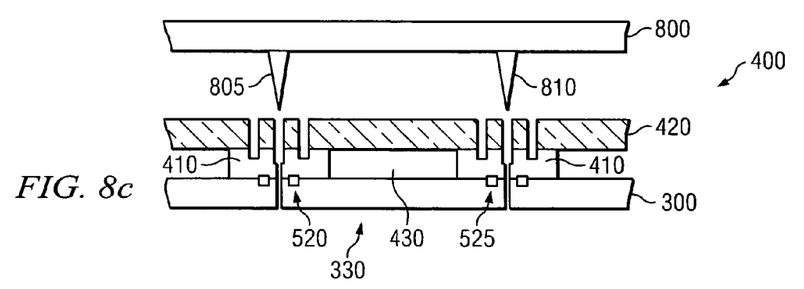

In another embodiment, the wedges may also be applied to the full cuts rather than the partial cuts. FIG. 8c is the cross-sectional elevation view of FIG. 7f illustrating a method of swizzle stick removal according to one embodiment of the present invention. In this embodiment, the first wedge member 805 and the second wedge member 810 of removal tool 800 are respectively positioned to substantially align with full cuts. When so positioned, the wedges are forced downward into the full cuts to a predetermined depth, or until failure of the material holding the swizzle sticks in place has been detected. In this embodiment, first wedge member 805 and second wedge member 810 may simply be formed with, or attached to removal tool 800 at a location appropriate for the operation they will be expected to perform. Or they may be adjustable in order to accommodate either of the methods shown in FIGS. 8a and 8c, or some variation thereof. In some applications, for example, it may be advantageous to apply one of the wedges to a full cut and another to a partial cut. Again, there may also be one or more than two wedges present on tool 800, and the number of wedges may be changeable.

FIG. 8b is the cross-sectional elevation view of FIG. 7f illustrating a method of swizzle stick removal according to another embodiment of the present invention. In this embodiment, removal tool 850 includes a single collet 855. Collet 855 in this embodiment forms an opening (not visible in FIG. 8b) in its face 856, which opening is in communication with a vacuum (negative differential pressure) source. When the collet is positioned as shown against the portion of the cover material to be removed, a vacuum is drawn and the collet is forced against the cover material (in the direction of the arrow) for a predetermined distance or until a failure is detected. As should be apparent, the now separated material will be held in place against the collet 855 and may be removed by movement of removal tool 850. The procedure may then be repeated as necessary to remove other portions of the cover. Note that although only one collet is shown in FIG. 8b, any number may be used. In addition, use of the collet 855, or of a number of such collets, may be combined with one or more wedge members (such as those shown in FIG. 8a) on the same removal tool (this embodiment is not shown).

Figure 9:
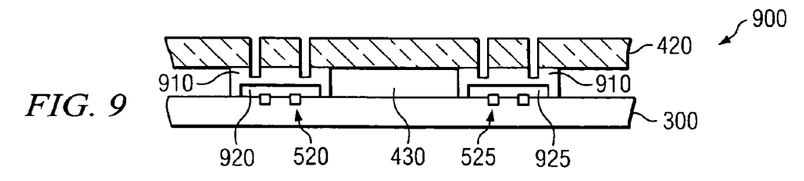
FIG. 9 is a cross-sectional elevation view of a portion of a wafer assembly according to an alternate embodiment of the present invention.

In another alternate embodiment, shown in FIG. 9, swizzle stick removal is facilitated through the use of cover having an interposer portion that is different from the interposer grid layer 410 illustrated, for example, in FIG. 4 and described above. FIG. 9 is the cross-sectional elevation view of a portion of a wafer assembly 900 according to an alternate embodiment of the present invention. In this embodiment, the wafer assembly includes semiconductor wafer 300 having bond pad sites 520 and 525, and glass wafer cover 420, which were also included in the wafer assembly 400 (see, for example, FIG. 4). In this embodiment, however, wafer assembly 900 also includes an interposer grid 910 forming a first recess 920 over first bond pad site 520 and a second recess 925 over second bond pad site 525. In this embodiment, each of these recesses is also formed over bond pad sites that are associated with respective adjacent dice, although this is not necessary. Note that the relative size of the recesses 920 and 925 are exaggerated for clarity, and in any event, the relative sizes of the features shown may vary in accordance with difference embodiments. When portion of the cover must be exposed by removal of the swizzle sticks, these recesses facilitate the removal under any of the methods described above (including the conventional manual method). In alternate embodiments (not shown) the cover assembly itself is integrally-formed rather then being assembled of two or more separate parts.

Although embodiments of the present invention and their advantages have been described in detail herein, it should be understood that various changes, substitutions and alterations can be made herein without departing from the spirit and scope of the invention as defined by the appended claims.

Moreover, the scope of the present application is not intended to be limited to the particular embodiments described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of fabricating a MEMS (micro-electromechanical system) device, the method comprising:
   forming a plurality of dice on a wafer, each die having an active area;
   mounting a cover on the wafer, the cover comprising a grid for supporting a cover wafer in a spaced-apart relationship above the active areas;
   cutting part-way through the cover to create at least one linear partial cut; and
   cutting through the cover and the wafer so as to separate each die of the plurality of dice from the other dice.

2. The method of claim 1, further comprising packaging at least one of the separated dice.

3. The method of claim 1, wherein the MEMS device is a DMD (digital micro-mirror device).

4. The method of claim 3, and further comprising installing the DMD in a projection display system.

5. The method of claim 1, further comprising mounting the wafer on an adhesive tape prior to cutting part-way through the cover.

6. The method of claim 1, further comprising substantially removing a portion of the cover disposed adjacent the at least one linear partial cut.

7. The method of claim 6, wherein the removal of the portion of the cover is performed automatically.

8. The method of claim 7, wherein the automatic removal is performed using a collet.

9. The method of claim 7, wherein the automatic removal is performed using at least one wedge member inserted into the at least one linear partial cut.

10. The method of claim 1, wherein the cutting steps are performed using a saw having a blade approximately 10 mils in width.

11. The method of claim 1, wherein the at least one linear partial cut comprises a pair of partial cuts disposed between the respective active areas of two adjacent dice.

12. The method of claim 1, wherein cutting through the cover and the wafer comprises cutting through a portion of the cover with a first cutting tool having a first thickness;
   withdrawing the first cutting tool, and cutting through the remainder of the cover and the wafer with a second cutting tool having a second thickness.

13. The method of claim 12, wherein the first cutting tool has a width of approximately 10 mils, and the second cutting tool has a width of approximately 4 mils.

14. A method for singulating a semiconductor wafer assembly having a wafer populated with a plurality of dice and a cover mounted on the wafer above the plurality of dice, said method comprising:

forming a linear partial cut into but not through the cover;

cutting through the cover and the wafer along at least one line substantially perpendicular to the linear partial cut; and cutting through the cover and the wafer along at least one line substantially parallel to the linear partial cut.

15. The method for singulating of claim 14, wherein the cover comprises a cover wafer and an interposer grid, and wherein the linear partial cut extends through the cover wafer and partially through the interposer grid.

16. The method for singulating of claim 15, further comprising, prior to forming the linear partial cut, mounting the interposer grid to the wafer and mounting the cover wafer to the interposer grid.

17. The method for singulating of claim 14, wherein each die of the plurality of dice includes an active area, and wherein the linear partial cut is formed between the respective active areas of at least two adjacent dice.

18. The method for singulating of claim 17, further comprising forming a second linear partial cut substantially parallel to the linear partial cut.

19. The method for singulating of claim 18, wherein the linear partial cut and the second linear partial cut are both formed between the respective active areas of at least two adjacent dice.

20. The method for singulating of claim 14, further comprising substantially removing from at least one die a portion of the cover disposed between the linear partial cut and an edge formed by cutting through the cover and the wafer along a line substantially parallel to the linear partial cut.

21. The method for singulating of claim 20, wherein the removing is done using an automated process.

22. The method for singulating of claim 20, wherein the removing exposes a bond pad site such that it may be accessed for making electrical connections.

23. The method for singulating of claim 14, wherein the plurality of dice are formed in rows and columns, and further comprising forming at least one linear partial cut for each row or for each column.

24. The method for singulating of claim 14, wherein the cuts perpendicular to the linear partial cut are made prior to those made parallel to the linear partial cut.

* * * * *